United States Patent

Tarumoto et al.

Patent Number: 5,702,847
Date of Patent: Dec. 30, 1997

[54] PHASE SHIFT PHOTOMASK, PHASE SHIFT PHOTOMASK BLANK, AND PROCESS FOR FABRICATING THEM

[75] Inventors: Norihiro Tarumoto; Hiroyuki Miyashita; Yukio Iimura; Koichi Mikami, all of Tokyo, Japan

[73] Assignee: Dai Nippon Printing Co., Ltd., Tokyo, Japan

[21] Appl. No.: 453,079

[22] Filed: May 30, 1995

Related U.S. Application Data

[63] Continuation of Ser. No. 112,965, Aug. 30, 1993, abandoned.

[30] Foreign Application Priority Data

| Sep. 1, 1992 | [JP] | Japan | 4-233731 |
| Sep. 28, 1992 | [JP] | Japan | 4-281153 |
| Sep. 28, 1992 | [JP] | Japan | 4-281154 |

[51] Int. Cl.$^6$ .................................. G03F 9/00
[52] U.S. Cl. ................ 430/5; 430/324; 428/78; 428/433
[58] Field of Search ............... 430/5, 322, 324; 428/78, 433

[56] References Cited

U.S. PATENT DOCUMENTS

| 3,986,876 | 10/1976 | Abita | 430/5 |
| 4,057,777 | 11/1977 | Merz et al. | 428/433 X |
| 4,506,006 | 3/1985 | Ruckert | 430/302 X |
| 4,533,624 | 8/1985 | Sheppard | 430/312 |
| 4,568,573 | 2/1986 | Sunada et al. | 427/350 |
| 4,995,339 | 2/1991 | Tobisawa et al. | 118/410 |
| 5,246,800 | 9/1993 | Muray | 430/5 |
| 5,248,575 | 9/1993 | Ogoshi | 430/5 |
| 5,292,623 | 3/1994 | Kemp et al. | 430/5 X |
| 5,362,591 | 11/1994 | Imai et al. | 430/5 |
| 5,368,963 | 7/1992 | Hanyu et al. | 430/5 |
| 5,472,812 | 7/1992 | Sekine | 430/5 |

Primary Examiner—S. Rosasco
Attorney, Agent, or Firm—Sughrue, Mion, Zinn, Macpeak & Seas, PLLC

[57] ABSTRACT

The invention relates to a phase shift photomask in which the peripheral region portion of a phase shift layer is removed by a relatively simple procedure and which has no or little defect and is inexpensive, a blank therefor, and a process for fabricating them. The process includes the steps of forming phase shift layer 23 all over the surface of one side of transparent substrate 21, and immersing only the peripheral region of substrate 21 in etching solution 25 to etch away the peripheral region of phase shift layer 23, whereby phase shift layer 27 is confined within an area smaller than that of substrate 21.

23 Claims, 9 Drawing Sheets

PHASE SHIFT PHOTOMASK, PHASE SHIFT PHOTOMASK BLANK, AND PROCESS FOR FABRICATING THEM

This is a continuation of application Ser. No. 08/112,965, filed Aug. 30, 1993 now abandoned.

BACKGROUND OF THE INVENTION

The present invention relates to a photomask used for the production of high-density integrated circuits such as LSIs (Large Scale Integrated circuits), VLSIs (Very Large Scale Integrated circuits), etc., and more particularly to a phase shift photomask itself, a blank therefor, and a process for fabricating them.

Semiconductor integrated circuits such as, LSIs and VLSIs are now fabricated by repeating the so-called lithography process wherein a resist is coated on the substrate to be processed, like a silicon wafer, and exposed to a desired pattern through a stepper, etc., followed by development, etching, doping, CVD (Chemical Vapor Deposition, etc.

A photomask used for such a lithography process and called a reticle is now increasingly required to have much higher accuracy in association with the high performance and high integration of semiconductor integrated circuits. Referring to a typical LSI, e.g., a DRAM (Dynamic Random Acess Memory), a 5x reticle for a 1 megabit DRAM, i.e., a reticle of size five times as large as that of an exposure pattern should be very small in terms of dimensional variation; the accuracy demanded is as small as 0.15 μm even at the mean value ±3σ (σ is the standard deviation). Likewise, a dimensional accuracy of 0.1 to 0.15 μm is demanded for 5x reticles for 4 megabit DRAMs; and a dimensional accuracy of 0.05 to 0.1 μm for 5x reticles for 16 megabit DRAMs.

In addition, the line widths of device patterns formed with the use of these reticles are now becoming finer; for instance, they must be 1.2 μm for 1 megabit DRAMs, 0.8 μm for 4 megabit DRAMs, and 0.6 μm for 16 megabit DRAMs. To meet such demands, various photolithography technologies are now under investigation.

In the case of the next generation device patterns of the 64 megabit DRAM class for instance, however, the use of stepper photolithography technologies using conventional reticles will place some limit on resolving the resist patterns. To exceed this limit, a reticle known as a phase shift mask and designed on the basis of a new technological paradigm has been proposed in the art, as set forth in JP-A-58-173744, JP-B-62-59296, etc.

Phase lithography making use of this phase shift photomask is a technology that enables the resolving power of a projected image to be enhanced by manipulation of the phase of light transmitting through the reticle. Phase shift lithography will now be explained briefly with reference to FIGS. 1 and 2.

FIG. 2 is a schematic of the principle of the phase shift technique, and FIG. 1 is a schematic of a conventional process. FIGS. 1(a) and 2(a) are sectional views of the reticles used, FIGS. 1(b) and 2(b) represent the amplitude of light transmitting through the reticles, FIGS. 1(c) and 2(c) illustrate the amplitude of light on the wafers, and FIGS. 1(d) and 2(d) show the intensity of light on the wafers. Reference numeral 1 is a substrate, 2p a light-blocking pattern, 3p a phase shifter, and L stands for light.

In the conventional arrangement, the substrate 1 made up of glass is simply provided with the light-blocking pattern 2p for the purpose of defining a light transmitting portion according to a given pattern, as shown in FIG. 1(a). In the phase shift lithography arrangement, however, the phase shifter 3 made up of a transmitting film is provided on either one of a pair of light transmitting portions of the reticle for phase reversal, as shown in FIG. 2.

In the conventional process, therefore, the amplitude of light on the reticle is in the same phase, as shown in FIG. 1(b), and so is the amplitude of light on the wafer, as shown in FIG. 1(c). Consequently, it is impossible to resolve the pattern on the wafer, as can be seen from FIG. 1(d). In phase shift lithography, in contrast, the light passing through the phase shifter 3p is in the opposite phase between adjacent patterns, so that the intensity of light can be reduced to zero at the boundary of the patterns and hence the adjacent patterns can be distinctly resolved, as can be seen from FIG. 2(d).

In phase shift lithography, therefore, it is possible to resolve patterns which have been incapable of being resolved in the prior art, resulting in some considerable improvement in resolution.

A typical process of fabricating conventional phase shift photomask blanks will then be explained with reference to FIG. 3. FIG. 3 is a conceptual sectional schematic showing the process for fabricating a phase shift photomask, wherein 1 is a substrate, 4 an electrically conductive layer, 3 a phase shift layer, S sputtering, and 2 a light-blocking layer.

The optically polished substrate 1 is first provided thereon with the conductive layer 4 (that is made up of NESA film and serves as an etching stopper layer for an ionizing radiation resist layer at the later step). On the layer 4 there is then applied and spin-coated a phase shifter material showing a good-enough transmittance with respect to exposure light, e.g., spin-on glass (hereinafter SOG for short). At this time, the four side regions of the rectangular substrate are thicker than the rest, as can be seen from FIG. 3(b).

Finally, a light-blocking material such as Cr is formed as film on the phase shifter material, whereby a phase shift photomask blank having the light-blocking layer 2 is completed.

Then, a typical process of fabricating a conventional shifter overlying type of phase shift photomask will be explained with reference to FIG. 4 that is a conceptual sectional schematic showing the process of fabricating the phase shift photomask in which 1 is a substrate, 4 an electrically conductive layer, 2p a light-blocking (chromium) pattern, 3 a phase shift layer, IR ionizing radiation, 5p a resist pattern, EP etching gas plasma, 3p a phase shifter pattern, and OP oxygen plasma.

As shown in FIG. 4(a), the substrate with the light-blocking (chromium) pattern 2p on it is inspected and repaired, if required, and washed. Then, as shown in FIG. 4(b), the phase shift layer 3 made up of $SiO_2$ or the like is spin-coated on the light-blocking pattern 2p. At this time, the four side regions of the rectangular substrate are thicker than the rest.

Subsequently, as shown in FIG. 4(c), the ionizing radiation resist layer 5 made up of chloromethylated polystyrene or the like is formed on the phase shift layer 3. After alignment done as in the prior art, as shown in FIG. 4(d), a given pattern is written on the ionizing radiation resist layer 5 by the ionizing radiation IR emanating from a radiation exposure system, developed and rinsed to form the resist pattern 5p, as shown in FIG. 4(e).

Then, heat and descumming treatments are carried out, if required. Following this, as shown in FIG. 4(f), the portions of the phase shift layer 3 under the openings in the resist pattern 5p is dry etched by etching gas plasma EP to form the phase shifter 3p. It is noted that the phase shifter 3p may also be formed by using wet etching in place of drying etching for which etching gas plasma EP is used.

Finally, the remaining resist is incinerated away by oxygen plasma OP, as shown in FIG. 4(g). Through the steps mentioned above, a phase shift photomask having the phase shifter 3p such as one shown in FIG. 4(h) is completed.

As can be appreciated from the foregoing explanation, the prior art phase shift photomasks and phase shift photomask blanks pose many problems, e.g., the frequent occurrence of defects, a rise in fabrication cost, and an increase in fabrication time. The reason is that when the phase shift layers represented by spin-on glass (SOG) are spin-coated, the phase shift layers become thicker on the peripheral regions of the rectangular substrates than on the rest, giving rise to cracking and dusting.

SUMMARY OF THE INVENTION

In view of such situations as mentioned above, an object of the invention is to provide a phase shift photomask which can be fabricated at low cost with no or little defect by removing the peripheral region of a phase shift layer in a relatively simple manner, a blank therefor, and a process for fabricating them.

According to one aspect of the invention, there is provided a process for fabricating a phase shift photomask blank having a phase shift layer, characterized in that it is simplified by using the step of etching away the peripheral region of the phase shift layer without recourse to any etching mask. It is understood that the invention encompasses not only this fabrication process but a phase shift photomask and a phase shift photomask blank fabricated thereby as well.

Etching away the peripheral region of the phase shift layer without recourse to any etching mask may typically be achieved in the following manners. For instance, when the photomask blank used is rectangular in shape, the blank is partly immersed on one side portion in an etching tank charged with an etching solution for removal, and pulled out to wash away the etching solution deposited thereon. Then, the remaining three side regions are successively treated as mentioned above, whereby all the peripheral region of the phase shift layer can be removed simply.

The phase shift layer used may be composed of material such as silicon oxide or spin-on glass (hereinafter often abbreviated as SOG). Here, if the phase shift layer has a thickness, d, given by $$d=\lambda/\{2(n-1)\}$$

where n is the index of refraction of the phase shift layer at an exposure wavelength λ, a portion having the phase shift layer shows a phase lag of 180° with respect to a portion having no phase shift layer.

For the etching stop layer, for instance, use may be made aluminum oxide, NESA glass (tin oxide·antimony oxide), and tin oxide. For the substrate, for instance, use may be made of high-purity quartz glass, calcium fluoride, and sapphire. For the light-blocking layer, for instance, use may be made of materials used for ordinary photomasks such as chromium, chromium nitride, chromium oxide, molybdenum silicide, and molybdenum silicide oxide, which may be used in the form of a single- or multi-layer.

For the etching solution, on the other hand, use may be made of a buffered aqueous solution of hydrofluoric acid, when the main component of the phase shift layer is silicon oxide. In particular, when the phase shift layer is made up of organic SOG, use may also be made of an aqueous solution sodium hydroxide, calcium hydroxide, or the like.

Thus, the phase shift photomask blank can be fabricated with no or little defect.

Accordingly, this blank can be used to fabricate a phase shift photomask with no or little defect.

According to another aspect of the invention, there is provided a process for fabricating a phase shift photomask blank and a phase shift photomask, characterized by including the step of providing on the peripheral region of the substrate a material capable of repelling an overlying phase shift layer, so that when the substrate is overlaid by the phase shift layer, only the peripheral region of the phase layer can be repelled by said material for removal. Here, too, it is understood that the invention includes a phase shift photomask blank prepared by this process and a phase shift photomask obtained by processing that blank.

For the layer of the material capable of repelling the overlying phase shift layer, for instance, use may be made of fluorocarbon resin.

FIG. 5 is a schematic of the steps of fabricating the phase shift photomask blank according to the second aspect of the invention. In FIG. 5, reference numeral 1 represents a substrate, 4 an electrically conductive layer, 6 a layer that repels an overlying phase shift layer, and 3k the phase shift layer after the lifting-off step. As shown in FIG. 5(a), the electrically conductive layer 4 is provided on the substrate 1, and the layer 6 capable of repelling the overlying phase shift layer is patterned on the layer 4, as shown in FIG. 5(b). Then, the phase shifter layer, if the phase shifter material is SOG, is formed by spin coating, whereby the edge portions of the overlying phase shift layer are repelled or lifted off.

The thus prepared phase shift photomask blank is washed and inspected as to whether or not there is any undesired defective region. In this manner, the phase shift layer of the phase shift photomask blank having the defect-free phase shift layer 3k shown in FIG. 5(c) after lifting-off is completed.

This lift-off process can be applied to the fabrication of a phase shifter overlying type of phase shift photomask in exactly the same manner as mentioned above, provided that it is necessary to form a material capable of repelling off the overlying phase shift layer on any desired region where the phase shift layer is to be removed prior to the formation of the phase shifter layer.

According to the third aspect of the invention, there is provided a process for fabricating a phase shift photomask blank and a phase shift photomask, which involves the steps of providing the peripheral region of a substrate with a layer of material capable of lifting off an overlying phase shift layer, providing the phase shift layer on the substrate, and lifting off the phase shift layer. Here, too, it is understood that the invention encompasses a phase shift photomask blank prepared by this lift-off process and a phase shift photomask obtained by processing this blank as well.

The layer of material capable of lifting off the overlying phase shift layer, for instance, may be dissolved by heating. In this case, the lifting-off may be achieved by dissolution by heating.

Furthermore, the invention provides a process for fabricating a phase shift mask blank and a phase shift mask, characterized in that the layer of material capable of lifting off the overlying phase shift layer is a material that is a solid at normal temperature (25° C.), has a melting point of 150° C. or lower, and is melted by heating at a suitable temperature.

FIG. 6 is a schematic showing the steps of fabricating a phase shift photomask blank according to the third aspect of the invention. In FIG. 6, 1 is a substrate, 4 an electrically conductive layer, 7 a layer of material capable of lifting off the overlying phase shift layer, 3 a phase shift layer, H a heat treatment, and 3k is a phase shift layer after lifting-off. As shown in FIG. 6(a), the conductive layer 4 is formed on the substrate 1. Then, as shown in FIG. 6(b), the layer 7 of material capable of lifting off the overlying phase shift layer is patterned on the peripheral region of the substrate (that may include the four corners in triangular forms). Subsequently, as shown in FIG. 6(c), the phase shifter layer 3, if the shifter material is SOG, is formed by spin coating. Thereafter, as shown in FIG. 6(d), the heat treatment H is done to lift off the layer 7 of material capable of lifting off the overlying phase shift layer, as shown in FIG. 6(e). The thus prepared phase shift photomask blank is washed and inspected as to whether or not there is any undesired defective region. In this manner, the phase shift of the phase shift photomask blank having the defect-free phase shift layer 3k after lifting-off is completed.

This lift-off process can be applied to the fabrication of a phase shifter overlying type of phase shift photomask in exactly the same manner as mentioned above, provided that it is necessary to form a pattern of material capable of repelling off the overlying phase shift layer on any desired region where the phase shift layer is to be removed prior to the formation of the phase shifter layer.

That is, the invention provides a phase shift photomask blank having at least a phase shift layer on a transparent substrate and a phase shift photomask obtained therefrom, characterized in that the peripheral region of the phase shift layer on the substrate is removed so as to confine the phase shift layer within an area smaller than that of the substrate.

In this case, the phase shift layer may be made up of spin-on glass.

Removal of the peripheral region of the phase shift layer may be achieved either by etching or by providing a layer of material capable of repelling or lifting off the phase shift layer on the peripheral region of the substrate.

According to the first aspect of the invention, there is thus provided a process for fabricating a phase shift photomask blank and a phase shift photomask, characterized by forming a phase shift layer all over the surface of one side of a transparent substrate, and immersing only the peripheral region of the substrate in an etching solution to etch away the peripheral region of the phase shift layer, thereby confining the phase shift layer within an area smaller than that of the substrate.

In this case, the etching may be done with the use of an alkaline etching solution.

According to the second aspect of the invention, there is thus provided a process for fabricating a phase shift photomask blank and a phase shift photomask, characterized by including the steps of providing the peripheral region of a transparent substrate with a layer of material capable of repelling an overlying phase shift layer, whereby, when the overlying phase shift layer is provided, only the peripheral region thereof is removed by repellence.

In this case, the layer of material capable of repelling the overlying phase shift layer may be made up of fluorocarbon resin.

According to the third aspect of the invention, there is thus provided a process for fabricating a phase shift photomask blank and a phase shift photomask, characterized by including the steps of providing the peripheral region of a transparent substrate with a layer of material capable of lifting off an overlying phase shift layer, providing the phase shift layer on the substrate, and lifting off the phase shift layer.

In this case, the lifting-off may be done by heating and the layer of material capable of lifting off the overlying phase shift layer may be made up of a material that is solid at normal temperature (25° C.), has a melting point of 150° C. or lower, and is melted by heating at a suitable temperature.

According to the invention wherein the peripheral region of a phase shift layer is removed either by etching or by providing a layer of material capable of repelling or lifting off the phase shift layer, it is possible to fabricate phase shift photomask blanks and phase shift photomasks within a short fabrication period of time and at lower cost, but with neither frequent occurrence of defects nor dusting.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

In what follows, the present invention will be explained, more specifically but not exclusively, with reference to some examples of the phase shift photomask blank, the process for fabricating the blank, and the phase shift photomask obtained from the blank.

EXAMPLE 1

Figure 1A:
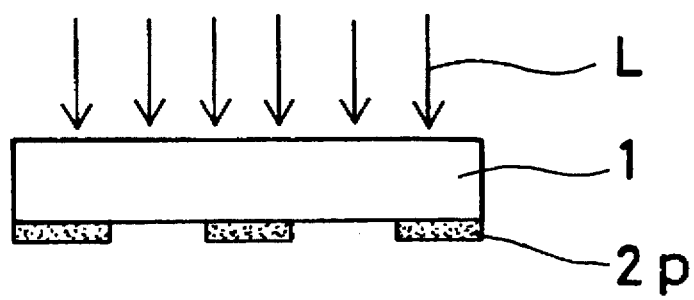
FIGS. 1(a–d) is a schematic illustrating a conventional technique.
Figure 1B:
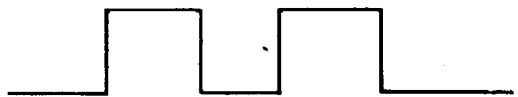
Figure 1C:
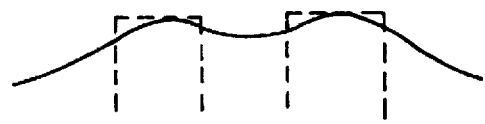
Figure 1D:
Figure 2A:
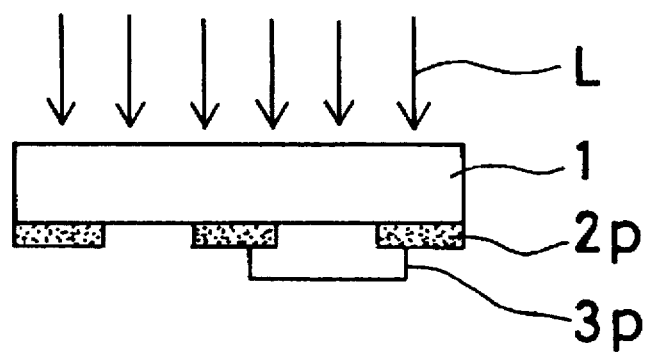
FIGS. 2(a–d) is a schematic showing phase shift techniques.
Figure 2B:
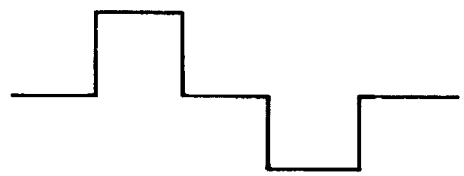
Figure 2C:
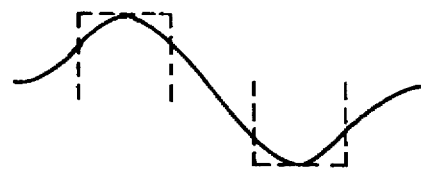
Figure 2D:
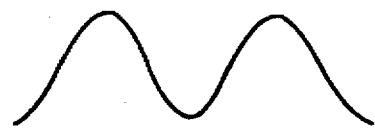
Figure 3A:
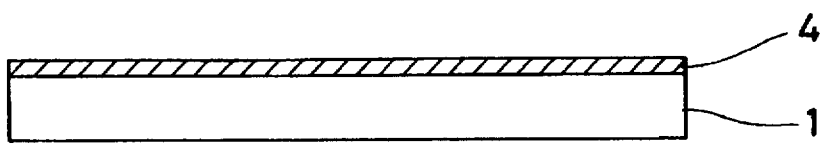
FIGS. 3(a–d) is a conceptual sectional illustration of the process of fabricating a conventional phase shift photomask blank.
Figure 3B:
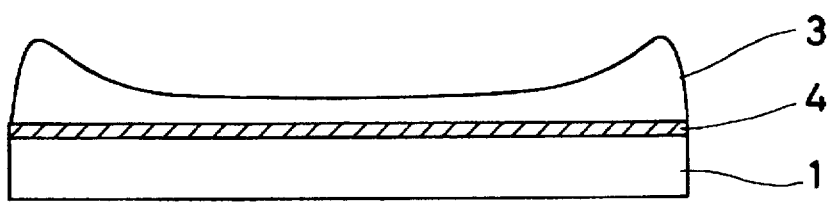
Figure 3C:
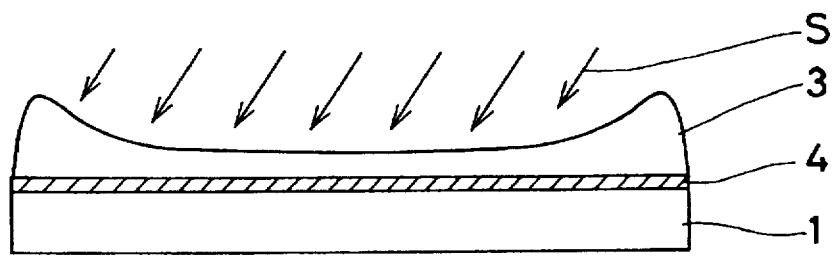
Figure 3D:
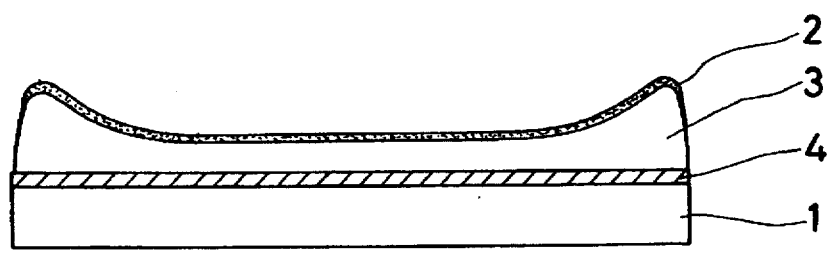
Figure 4A:
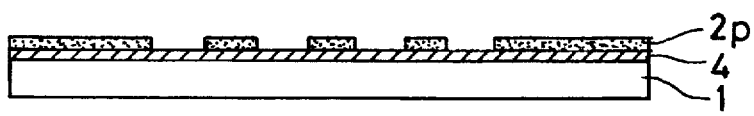
FIGS. 4(a–h) is a conceptual sectional illustration of the process of fabricating a conventional phase shift photomask.
Figure 4B:
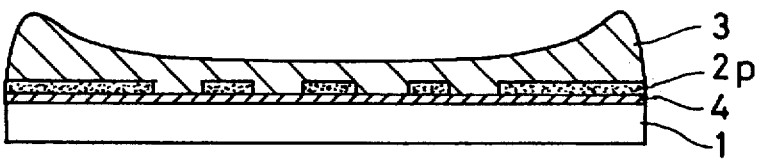
Figure 4C:
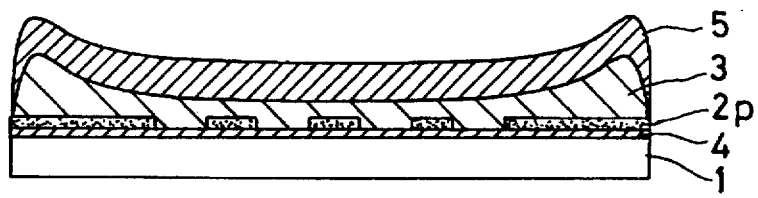
Figure 4D:
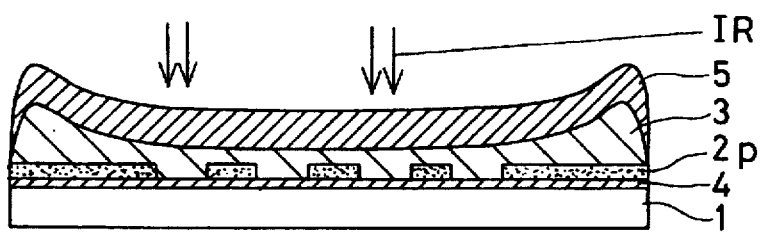
Figure 4E:
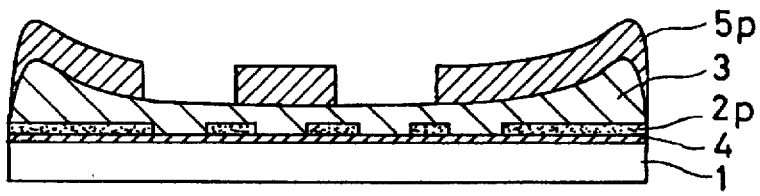
Figure 4F:
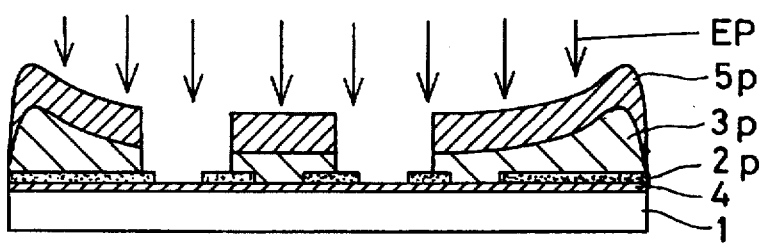
Figure 4G:
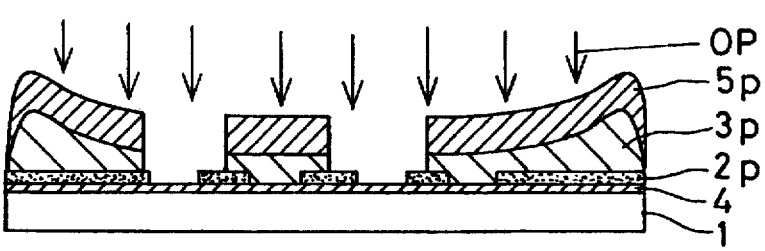
Figure 4H:
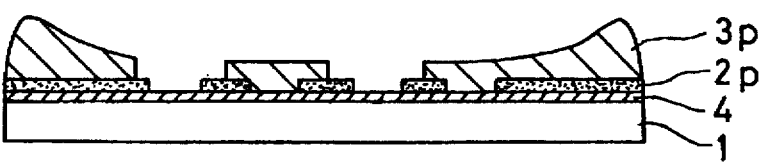
Figure 5A:
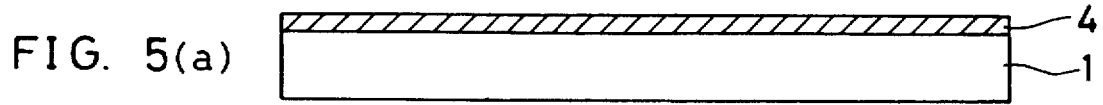
FIGS. 5(a–c) is a conceptual sectional illustration of the process for fabricating a phase shift photomask blank according to the second aspect of the invention.
Figure 5B:
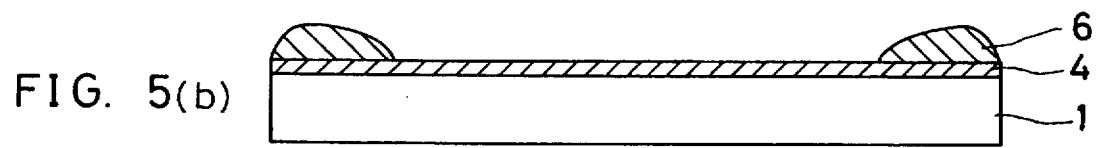
Figure 5C:
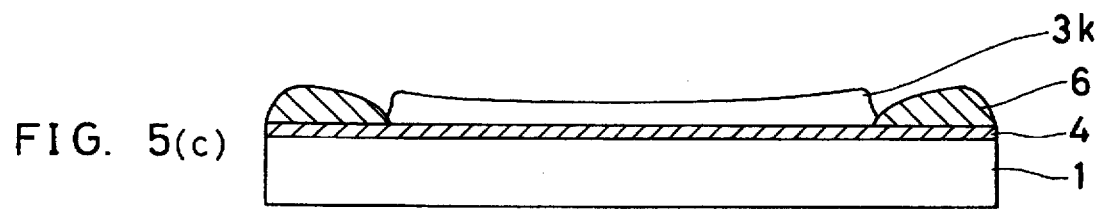
Figure 6A:
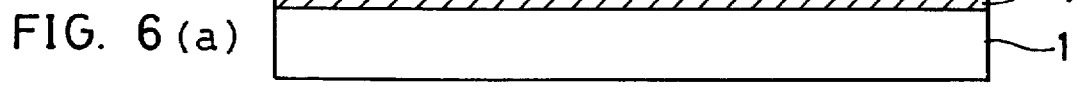
FIGS. 6(a–e) is a conceptual sectional illustration of the process for fabricating a phase shift photomask blank according to the third aspect of the invention.
Figure 6B:
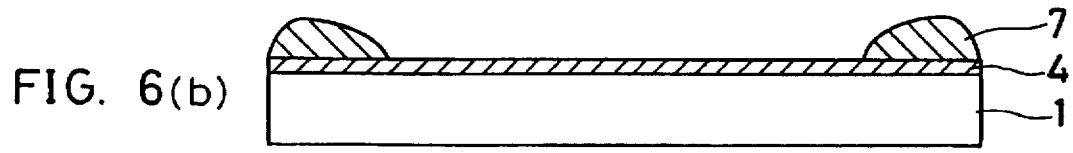
Figure 6C:
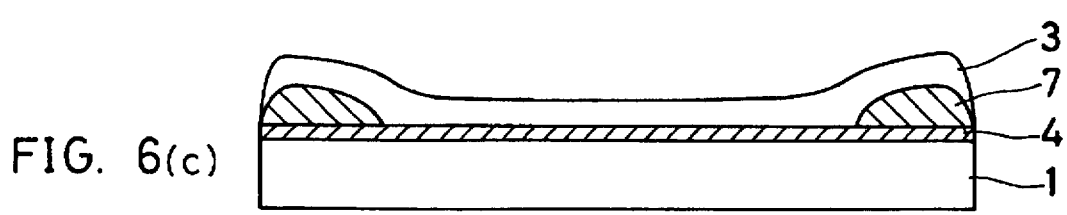
Figure 6D:
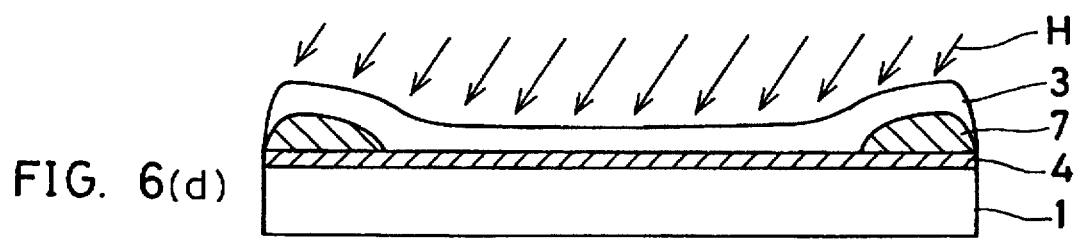
Figure 6E:
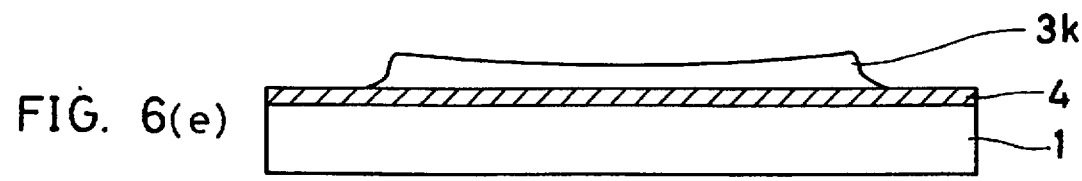
Figure 7:
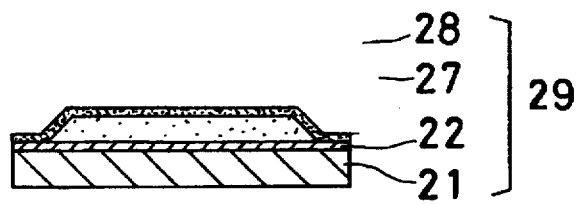
FIG. 7 is a sectional illustration of a phase shift photomask blank according to the first embodiment according to the first aspect of the invention.

FIG. 7 is a sectional view of the phase shift photomask of the first example according to the first aspect of the invention, and FIG. 8 is a sectional schematic for illustrating one example of the process for fabricating it.

Figure 8A:
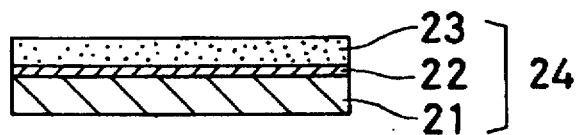
FIGS. 8(a–c) is sectional illustration of one embodiment of the process for fabricating the blank of FIG. 7.

As shown in FIG. 8(a), a high-purity quartz glass substrate 21 of 5 to 6 square inches in size and 0.09 to 0.25 inches in thickness is first provided thereon with an etching stop layer 22 having a thickness of about 10 to 110 nm and composed mainly of NESA glass (tin oxide•strontium oxide), tin oxide, aluminum oxide, or the like, by means of ordinarily available vapor deposition, ion plating, sputtering or other known techniques. The etching stop layer 22 is further spin-coated thereon with commercially available spin-on glass (SOG, e.g., USG-50S or Accuglass 311S made by Allied Signal Corp.). After this, baking is done at a temperature of 200 to 350° C. to form a phase shift layer 23 of 400 to 440 nm in thickness that is used for i-line exposure (at a wavelength of 365 nm).

Figure 8B:
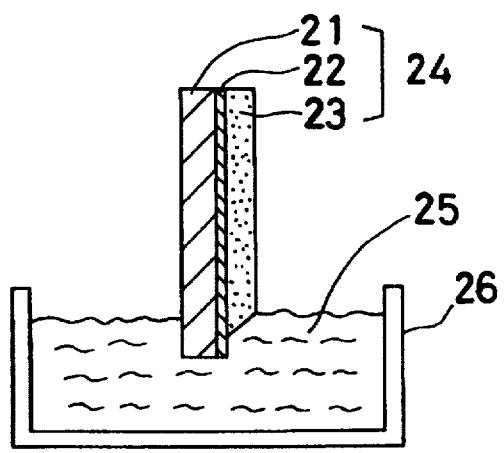
Figure 8C:
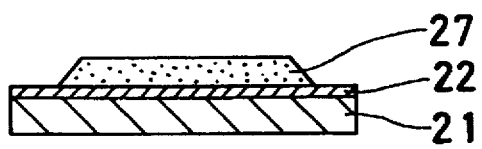

Then, as shown in FIG. 8(b), a substrate 24 formed, as shown in FIG. 8(a), is immersed, while remaining upright, in an etching tank 26 charged with an etching solution 25, so that one side thereof can be immersed by a depth of 2 to 10 mm in the etching solution 25 for a constant period of time, and then pulled out, just after which it is washed with water. After this procedure is repeated for each of the remaining three sides, drying is done to form on the etching stop layer 22 the phase shift layer 27, all the four side portions of which have been removed, as shown in FIG. 8(c).

Here a buffered aqueous solution of hydrofluoric acid consisting of a 50% aqueous solution of hydrofluoric acid and a 40% aqueous solution of ammonium fluoride at about 1:7 to 30 proportions may be used as the etching solution. It is noted, however, that when organic SOG (commercial SOG, e.g., Accuglass 311S) is used, use may be made of an alkaline aqueous solution containing about 10 to 40% of sodium hydroxide, potassium hydroxide, or the like. While SOG has been described as being etched after baking, it is understood that SOG may be etched prior to baking.

Finally, a single- or multi-layer form of light-blocking film 28 composed mainly of chromium, chromium nitride, chromium oxide or the like is formed on the phase shift layer 27 in conventional manners such as sputtering. In this manner, a phase shift photomask blank according to one example of the invention, such as one shown at 29 in FIG. 7, is completed.

Here it goes without saying that the light-blocking layer 28 may be larger in area that the phase shift layer 27, as shown in FIG. 7, or may have an identical or smaller area than the phase shift layer. It is noted that the transmittance of the light-blocking layer 28 with respect to exposure light may be less than 1% as usual, while the transmittance of the light-blocking layer for a halftone type of phase shift photomask may lie in the range of about 1 to 50%. In the case of a halftone type of phase shift photomask blank, however, it is desired that the total of the phase shift of exposure light passing through the two layers, i.e., the light-blocking and phase shift layers 28 and 27 amount to 160° to 200°.

EXAMPLE 2

Figure 9:
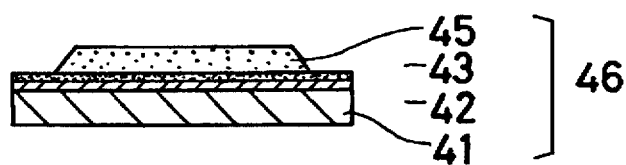
FIG. 9 is a sectional illustration of a phase shift photomask blank according to another embodiment.
Figure 10:
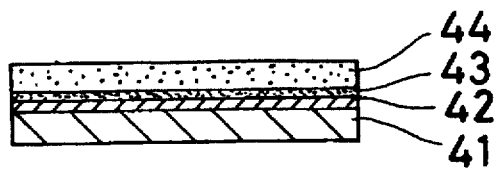
FIG. 10 is a sectional illustration of one embodiment of the process for fabricating the blank of FIG. 9.

FIGS. 9 and 10 are a sectional view of another example of the phase shift photomask blank according to the first aspect of the invention and a sectional view of another example of the process for fabricating it, respectively.

As shown in FIG. 10, a high-purity quartz substrate 41 is first provided thereon with an etching stop layer 42, on which a light-blocking layer 43 composed chiefly of chromium or the like is sputtered or otherwise formed in conventional manners. Following this, a phase shift layer 44 is formed. In this connection, it is noted that when the layer 44 is made up of silicon oxide, it may be formed by ordinary vapor deposition, CVD, sputtering or other known techniques, and that when the layer 44 is made up of SOG, it may be formed by spin coating.

Further, all the peripheral region of the phase shift layer 44 is removed by a simple etching procedure that does not use any etching mask as in Example 1. In this way, a phase shift photomask blank 46 having a phase shift layer 45, all the peripheral region of which has been removed, as shown in FIG. 9.

EXAMPLE 3

Figure 11:
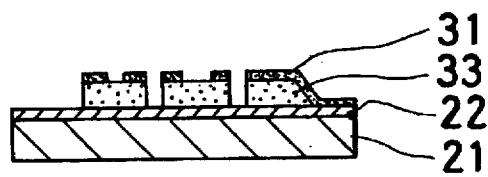
FIG. 11 is a sectional illustration of one embodiment of a phase shift photomask prepared by processing the blank of FIG. 7.

FIGS. 11 and 12 are a sectional view of one example of the phase shift photomask according to the first aspect of the invention, which is obtained by processing the phase shift photomask blank 29 shown in FIG. 7, and a sectional schematic of the process for fabricating it, respectively.

Figure 12A:
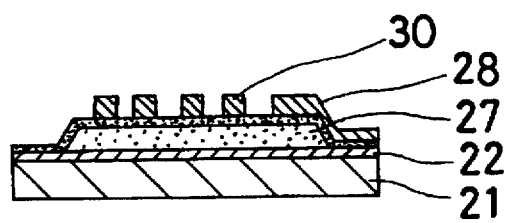
FIGS. 12(a–c) is a sectional illustration of the process for fabricating the photomask of FIG. 11.
Figure 12B:
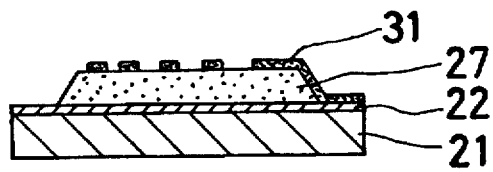

As shown in FIG. 12(a), a desired resist pattern 30 is first formed on a light-blocking layer 28 in conventional manners. Then, the unpatterned portions of the light-blocking layer 28 are wet or dry etched away, and the remaining resist pattern 30 is incinerated away by oxygen plasma, thereby making a light-blocking pattern 31, as shown in FIG. 12(b).

Figure 12C:
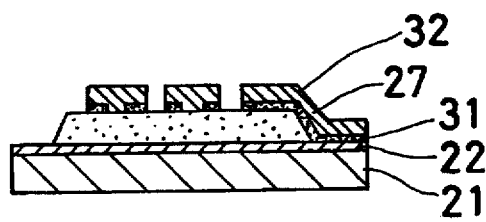

Then, as shown in FIG. 12(c), a desired resist pattern 32 is aligned with a given position on the light-blocking pattern 31 and formed thereon in a conventional manner. Following this, the unpatterned portions of the phase shift layer 27 are dry etched away with gas such as $CF_4$ to form a phase shift pattern 33. Then, the remaining resist is incinerated away or otherwise removed to make such a phase shift photomask as shown in FIG. 11 complete.

EXAMPLE 4

Figure 13:
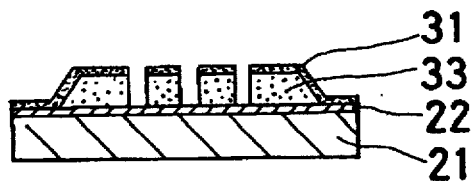
FIG. 13 is a sectional illustration of a halftone type of phase shift photomask according to another embodiment.

This is directed to another example of the phase shift photomask according to the first aspect of the invention, which is obtained by using the phase shift photomask blank 29 shown in FIG. 7. In this example, a halftone type of phase shift photomask is obtained, in which, as illustrated in FIG. 13, the area of the phase shift pattern 33 is coincident with that of the overlying light-blocking pattern 31, and the transmittance of the light-blocking layer 31 with respect to exposure light is 1 to 50%.

EXAMPLE 5

Figure 14:
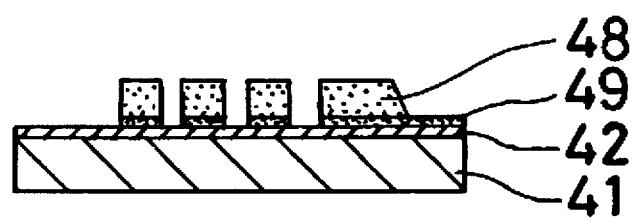
FIG. 14 is a sectional illustration of a halftone type of phase shift photomask according to still another embodiment.

This is directed to one example of the phase shift photomask according to the invention, which is obtained by using the phase shift photomask blank 46 shown in FIG. 9. In this example, a halftone type of phase shift photomask is obtained, in which, as shown in FIG. 14, the area of the halftone light-blocking pattern 49 is coincident with that of the overlying phase shift pattern 48.

EXAMPLE 6

Figure 15:
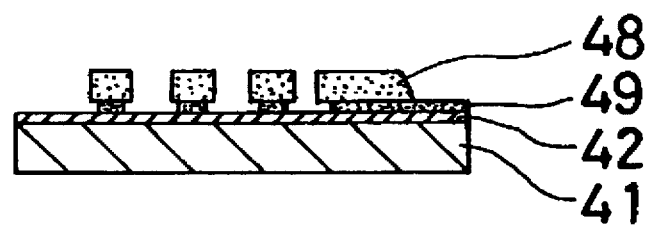
FIG. 15 is a sectional illustration of an edge-enhanced type of phase shift photomask according to still another embodiment.

This is directed to another example of the phase shift photomask according to the invention, which is obtained by using the same phase shift photomask blank 46. In this example, a so-called edge-enhanced type of phase shift photomask is obtained, in which, as shown in FIG. 15, the area of the phase shift pattern 48 is substantially coincident with, but is slightly smaller than, that of the underlying light-blocking pattern 49 composed of an ordinary light-blocking layer with a transmittance of less than 1% with respect to exposure light.

EXAMPLE 7

This is directed to one example of the second aspect of the invention. In this example, a quartz substrate with an electrically conductive NESA film on it was provided with a fluorocarbon resin pattern capable of repelling liquid SOG on only the region thereof, from which the phase shift layer was to be removed, i.e., on the four side and corner portions. The SOG was then spin-coated.

Following this, chromium was sputtered to form a light-blocking layer. The thus obtained phase shift photomask blank is found to show no peeling of SOG and be of good quality and high accuracy.

EXAMPLE 8

This is directed to another example of the second aspect of the invention. In this example, a substrate with a light-blocking film pattern of chromium was provided with a fluorocarbon resin pattern capable of repelling liquid SOG on only the region thereof, from which the phase shift layer was to be removed. Then, SOG was spin-coated on the substrate. As a result, it was found that no SOG was formed on only the upper region with the fluorocarbon resin pattern on it.

In this way, the phase shift layer with no unnecessary region was formed. As in the prior art, the resist layer was then formed, followed by the etching of the phase shift layer to form a phase shift pattern (a phase shifter). Finally, the resist pattern was stripped. The thus completed phase shift photomask showed no peeling of SOG. According to the invention, it is found that phase shift photomasks of high accuracy can be obtained at decreased reject rates for a short fabrication period of time.

EXAMPLE 9

This is directed to one example of the third aspect of the invention. In this example, a quartz substrate with an electrically conductive NESA film layer on it was provided with a lift-off pattern (of material capable of lifting off the overlying phase shift layer) made up of phenol (with a melting point of 40.85° C.) on only the region thereof, from which the phase shift layer was to be removed. Then; SOG was spin-coated on the substrate.

This substrate was heated to about 60° C. to dissolve the lift-off pattern, thereby lifting off the lift-off pattern together with the portion of the phase shift layer (SOG) overlying the lift-off pattern. Following this, chromium was sputtered to form a phase shift mask blank with a light-blocking layer on it. According to the invention, it is thus possible to fabricate at decreased reject rates phase shift mask blanks with no peeling of SOG and having high accuracy.

EXAMPLE 10

This is directed to another example of the third aspect of the invention. In this example, a quartz substrate with an electrically conductive NESA film layer on it was provided with a lift-off pattern (of material capable of lifting off the overlying phase shift layer) made up of phenol (with a melting point of 40.85° C.) on only the region thereof, from which the phase shift layer was to be removed. Then, SOG was spin-coated on the substrate.

This substrate was heated to about 60° C. to dissolve the lift-off pattern, thereby lifting off the lift-off pattern together with the portion of the phase shift layer (SOG) overlying the lift-off pattern. In this way, the phase shift layer having no defective region was prepared. As in prior art, the resist layer was then formed, followed by the etching of the phase shift layer to form a phase shift pattern (a phase shifter). Finally, the resist pattern was stripped.

The thus completed phase shift photomask showed no peeling of SOG. According to the invention, it is thus found that phase shift photomasks of high accuracy can be obtained at decreased reject rates for a short fabrication period of time.

According to the invention wherein the peripheral region of a phase shift layer is removed either by etching or by providing a layer of material capable of repelling or lifting off the phase shift layer, as will be appreciated from the foregoing explanation, it is possible to fabricate phase shift photomask blanks and phase shift photomasks within a short fabrication period of time and at lower cost, but with neither frequent occurrence of defects nor dusting.

What we claim is:

1. A phase shift photomask blank for projection exposure having at least a phase shift layer comprising spin-on glass on a transparent substrate wherein light which impinges on said photomask blank and passes through said phase shift layer is shifted in phase, characterized in that the peripheral region of the phase shift layer on the substrate is removed to confine the phase shift layer within an area smaller than that of the substrate.

2. A phase shift photomask blank according to claim 1, characterized in that the removal of the peripheral region of the phase shift film is achieved by etching.

3. A phase shift photomask blank according to claim 1, characterized in that the removal of the peripheral region of the phase shift film is achieved by providing a layer of material capable of repelling the phase shift layer on the peripheral region of the substrate.

4. A phase shift photomask blank according to claim 1, characterized in that the removal of the peripheral region of the phase shift film is achieved by providing a layer of material capable of lifting off the phase shift layer on the peripheral region of the substrate.

5. A phase shift photomask having at least a phase shift pattern on a transparent substrate, characterized in that the peripheral region of the phase shift pattern area on the substrate is removed to confine the phase shift layer within an area smaller than that of the substrate.

6. A phase shift photomask according to claim 5, characterized in that the phase shift pattern is made up of spin-on glass.

7. A phase shift photomask according to claim 5 or 6, characterized in that the removal of the peripheral region of the phase shift pattern area is achieved by etching.

8. A phase shift photomask according to claim 5 or 6, characterized in that the removal of the peripheral region of the phase shift pattern area is achieved by providing, on the peripheral region of the substrate, a layer of material capable of repelling the phase shift layer.

9. A phase shift photomask according to claim 5 or 6, characterized in that the removal of the peripheral region of the phase shift pattern area is achieved by providing, on the peripheral region of the substrate, a layer of material capable of lifting off the phase shift pattern area.

10. A process for fabricating a phase shift photomask blank for projection exposure, characterized by:

forming a phase shift layer comprising spin-on glass all over the surface of one side of a transparent substrate so that light which impinges on said photomask blank and passes through said phase shift layer is shifted in phase, and immersing only the peripheral region of the substrate in an etching solution to etch away the peripheral region of the phase shift layer, whereby the phase shift layer is confined within an area smaller than that of the substrate.

11. A process for fabricating a phase shift photomask blank according to claim 10, characterized in that the etching is done with the use of an alkaline etching solution.

12. A process for fabricating a phase shift photomask, characterized by:

forming a phase shift pattern all over the surface of one side of a transparent substrate, and immersing only the peripheral region of the substrate in an etching solution to etch away the peripheral region of the phase shift pattern, whereby the phase shift pattern is confined within an area smaller than that of the substrate.

13. A process for fabricating a phase shift photomask according to claim 12, characterized in that the etching is done with the use of an alkaline etching solution.

14. A process for fabricating a phase shift photomask blank for projection exposure, characterized by including the step of providing a layer of material capable of repelling an overlying phase shift layer comprising spin-on glass on the peripheral region of a transparent substrate, whereby, when the overlying phase shift layer is provided so that light which impinges on said photomask blank and passes through said phase shift layer is shifted in phase, only the peripheral region of the phase shift layer is repelled by said layer of material for removal.

15. A process for fabricating a phase shift photomask blank according to claim 14, characterized in that the material provided on the peripheral region of the transparent substrate is a fluorocarbon resin.

16. A process for fabricating a phase shift photomask, said process comprising the steps of:

providing a layer of material on the peripheral region of a transparent substrate;

providing a phase shift layer overlying said transparent substrate, wherein the material provided on the peripheral region of the transparent substrate repels formation of a phase shift pattern area so that a phase shift pattern area is not formed on the peripheral region of the transparent substrate.

17. A process for fabricating a phase shift photomask according to claim 16, characterized in that the material provided on the peripheral region of the transparent substrate is a fluorocarbon resin.

18. A process for fabricating a phase shift mask blank for projection exposure, characterized by including the steps of providing a layer of material capable of lifting off an overlying phase shift layer comprising spin-on glass on the peripheral region of a transparent substrate, providing the overlying phase shift layer so that light which impinges on said phase shift mask blank and passes through said phase shift layer is shifted in phase, and lifting off the phase shift layer.

19. A process for fabricating a phase shift mask blank according to claim 18, characterized in that the lifting-off is done by heating.

20. A process for fabricating a phase shift mask blank according to claim 19, characterized in that the material capable of lifting off the overlying phase shift pattern area is a material that is solid at normal temperature or 25° C., has a melting point of 150° C. or lower, and is melted by heating at a suitable temperature.

21. A process for fabricating a phase shift mask, comprising the steps of providing a layer of material capable of lifting off an overlying phase shift pattern area comprising spin-on glass on the peripheral region of a transparent substrate, providing the overlying phase shift pattern area, and lifting off the phase shift pattern area.

22. A process for fabricating a phase shift mask according to claim 21, characterized in that the lifting-off is done by heating.

23. A process for fabricating a phase shift mask according to claim 22, characterized in that the material capable of lifting off the overlying phase shift layer is a material that is solid at normal temperature or 25° C., has a melting point of 150° C. or lower, and is melted by heating at a suitable temperature.

* * * * *